(12) United States Patent
Illek

(10) Patent No.: US 7,678,591 B2
(45) Date of Patent: Mar. 16, 2010

(54) SEMICODUCTOR CHIP AND METHOD FOR PRODUCTION THEREOF

(75) Inventor: Stefan Illek, Donaustauf (DE)

(73) Assignee: Osram GmbH, Munich (DE)

( * ) Notice: Subject to any disclaimer, the term of this patent is extended or adjusted under 35 U.S.C. 154(b) by 0 days.

(21) Appl. No.: 10/344,804

(22) PCT Filed: Jul. 18, 2001

(86) PCT No.: PCT/DE01/02702

§ 371 (c)(1),
(2), (4) Date: Feb. 14, 2003

(87) PCT Pub. No.: WO02/15286

PCT Pub. Date: Feb. 21, 2002

(65) Prior Publication Data

US 2004/0099873 A1    May 27, 2004

(30) Foreign Application Priority Data

Aug. 18, 2000    (DE) ................................ 100 40 448

(51) Int. Cl.
*H01L 33/00* (2006.01)
(52) U.S. Cl. ..................... 438/25; 372/50.123
(58) Field of Classification Search .......... 257/79–103; 438/22, 25, 26, 28; 372/43–50, 50.12, 50.121, 372/50.122, 50.123
See application file for complete search history.

(56) References Cited

U.S. PATENT DOCUMENTS

| 3,728,236 | A |   | 4/1973  | Weller et al. ............. 204/129.1 |
| 3,946,334 | A |   | 3/1976  | Yonezu et al. .......... 331/94.5 H |
| 4,095,330 | A | * | 6/1978  | Kim ........................... 438/412 |
| 4,350,990 | A |   | 9/1982  | Lo ............................... 357/16 |
| 4,374,390 | A | * | 2/1983  | Lee ............................... 257/89 |
| 4,794,053 | A | * | 12/1988 | Tustison .................... 428/627 |
| 5,027,168 | A | * | 6/1991  | Edmond ..................... 257/103 |
| 5,068,868 | A | * | 11/1991 | Deppe et al. ............. 372/45.01 |
| 5,144,413 | A |   | 9/1992  | Adlerstein ................... 357/81 |
| 5,401,983 | A |   | 3/1995  | Jokerst et al. ................ 257/82 |
| 5,412,249 | A | * | 5/1995  | Hyugaji et al. ............. 257/745 |

(Continued)

FOREIGN PATENT DOCUMENTS

CN    1262528 A    8/2000

(Continued)

OTHER PUBLICATIONS

Rudolf F. Graf, "Modern Dictionary of Electronics", Newnes, Boston (seventh ed.; 1999) ISBN 0-7506-9866-7, pp. 252, 314.*

(Continued)

*Primary Examiner*—Thomas L Dickey
(74) *Attorney, Agent, or Firm*—Cohen Pontani Lieberman & Pavane LLP

(57) ABSTRACT

For producing semiconductor chips by thin-film technology, an active layer (2) that has been grown on a substrate, with contact layers on the back side that have a base layer (3), is reinforced by a reinforcement layer (4). Next, an auxiliary carrier layer (5) is applied, which makes the further processing of the active layer (2) possible. The reinforcement layer (4) and the auxiliary carrier layer (5) replace the mechanical carriers used in conventional methods.

28 Claims, 2 Drawing Sheets

U.S. PATENT DOCUMENTS

| | | | |
|---|---|---|---|
| 5,631,475 A * | 5/1997 | Watabe et al. | 257/94 |
| 5,657,336 A * | 8/1997 | Okuyama et al. | 372/45.01 |
| 5,787,104 A * | 7/1998 | Kamiyama et al. | 372/43.01 |
| 5,862,167 A | 1/1999 | Sassa et al. | 372/45 |
| 5,919,713 A | 7/1999 | Ishii et al. | 437/227 |
| 5,998,238 A | 12/1999 | Kosaki | 438/114 |
| 6,060,730 A | 5/2000 | Tsutsui | 257/103 |
| 6,288,416 B1 * | 9/2001 | Koike et al. | 257/94 |
| 6,299,056 B1 * | 10/2001 | Oota | 228/177 |
| 6,424,418 B2 * | 7/2002 | Kawabata et al. | 356/445 |
| 6,470,039 B1 * | 10/2002 | Ukita | 372/46 |
| 6,583,444 B2 * | 6/2003 | Fjelstad | 257/82 |
| 6,617,774 B1 * | 9/2003 | Kusunoki et al. | 313/311 |
| 6,800,500 B2 * | 10/2004 | Coman et al. | 438/22 |
| 2001/0042866 A1 * | 11/2001 | Coman et al. | 257/103 |

FOREIGN PATENT DOCUMENTS

| | | |
|---|---|---|
| DE | 100 00 088 A1 * | 8/2000 |
| DE | 10000088 A1 | 8/2000 |
| EP | 0730311 A2 | 4/1996 |
| EP | 0740376 A1 | 10/1996 |
| EP | 0810674 A2 | 3/1997 |
| EP | 0905797 A2 | 3/1999 |
| FR | 2538616 | 6/1984 |
| JP | 61034983 | 2/1986 |
| JP | 361034983 A * | 2/1986 |
| JP | 09213996 A | 5/1996 |
| JP | 11068157 | 9/1999 |

OTHER PUBLICATIONS

Merriam-Webster's Collegiate Dictionary, tenth Edition, Merriam-Webster Inc., Springfield, MA (USA), 1998; pp. 267-268.*

M. Fukuda, "Optical Semiconductor Devices, Wiley Series in Microwave and Optical Engineering", John Wiley & Sons, New York (1999), pp. 211 and 243-244.*

M. Fukuda, "Optical Semiconductor Devices, Wiley series in microwave and optical engineering", K. Chang Editor, John Wiley & Sons, Inc., New York 1999, pp. 211-213.*

McCandless et al., "Galvanic deposition of cadmium sulfide thin films", in "Solar Energy Materials and Solar Cells", vol. 36, pp. 369-379 (1995).*

* cited by examiner

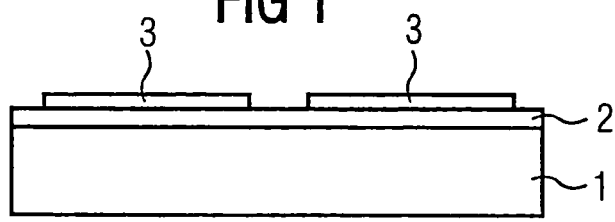
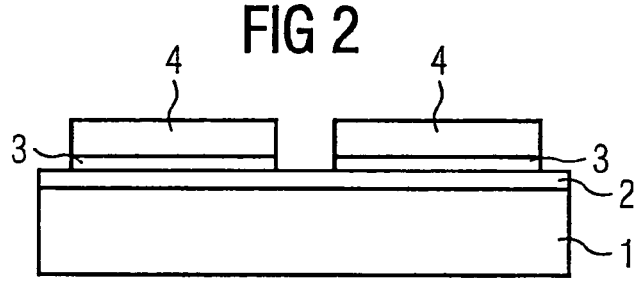
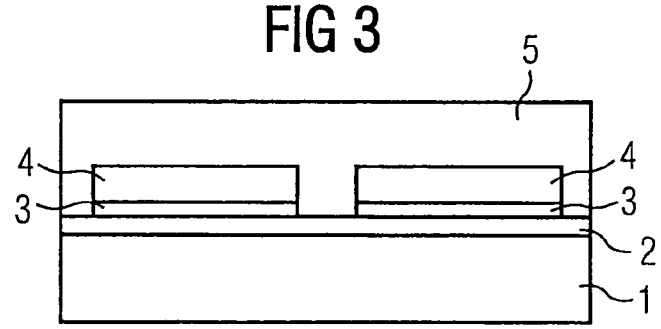
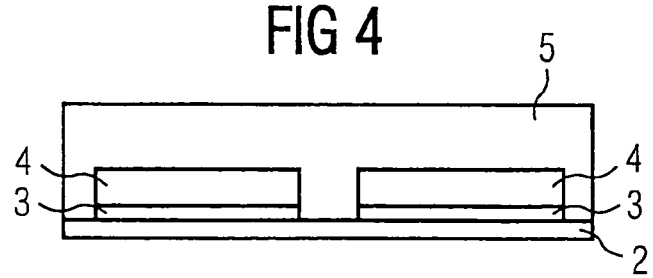

SEMICODUCTOR CHIP AND METHOD FOR PRODUCTION THEREOF

The invention relates to a semiconductor chip, with an active layer that has a photon-emitting zone, with contact points embodied on both sides of the active layer.

The invention also relates to a method for producing a semiconductor chip by thin-film technology, having the following method steps:

embodying an active layer, which has a photon-emitting zone, on a substrate;

embodying contact points on the active layer; and removing the substrate.

BACKGROUND OF THE INVENTION

Such semiconductor chips are known from European Patent Disclosure EP 0 905 797 A2, for instance. The active layer of these semiconductor chips is typically grown on a substrate. The substrate will in general absorb some of the photons emitted by the active layer. To increase the light yield, it is therefore known to separate the active layer from the substrate and apply it to a carrier body that is separated from the active layer by a reflective layer. Securing it to a carrier body is necessary in order to assure the requisite mechanical strength in the subsequent process steps.

One disadvantage of the known semiconductor chips is that transferring the active layer from the substrate onto the carrier body is difficult to handle. In particular, the bond between the carrier body and the active layer can in general be accomplished only by employing high mechanical pressure or an elevated temperature. Both of these can be harmful to the active layer.

SUMMARY OF THE INVENTION

One object of the invention is to create a semiconductor chip which can be produced in a simple way by thin-film technology.

It is also an object of the invention to create a corresponding method suitable for producing the semiconductor chip.

These and other objects are attained in accordance with one aspect of the present invention directed to a semiconductor chip, with an active layer that has a photon-emitting zone, onto both sides of which layer contact points are embodied, with one of the contact points being embodied as a contact layer whose thickness is at least equal to the thickness of the active layer.

It is therefore unnecessary, for the sake of further processing of the active layer, to apply it to a carrier body. Moreover, contact layers of great thickness can be produced in the conventional way with the usual materials. It is therefore unnecessary for new methods to be developed in order to make contact layers that are thick enough. Overall, the invention therefore makes substantially simplified production of semiconductor chips by thin-film technology possible.

Another aspect of the present invention is directed to a method for producing a semiconductor chip by thin-film technology, having the following method steps: embodying an active layer, which has a photon-emitting zone, on a substrate; embodying contact points on the active layer; and removing the substrate. One of the contact points is embodied as a contact layer, whose thickness is greater than the thickness of the active layer.

In a preferred embodiment of the method, after the galvanic application of a reinforcement layer to the contact layer, a surface-covering galvanic auxiliary carrier layer is deposited on the active layer.

By means of this kind of auxiliary carrier layer, the active layer can be developed further into a solid, rigid body that is equivalent in its mechanical properties to a wafer.

In a further preferred feature of the method, the auxiliary carrier layer is made of a material that can be removed selectively relative to the reinforcement layer.

This choice of material makes it possible for the semiconductor chips, after their processing, to be separated into individual semiconductor chips without using sawing methods. Hence there is no waste of material, and there is no need to design the semiconductor chips in such a way as to take the imprecisions of sawing into account.

BRIEF DESCRIPTION OF THE DRAWINGS

The invention will be described in detail below in conjunction with the accompanying drawing. Shown are:

FIG. 1, a cross section through a layer sequence, with a substrate and an active layer applied over it that is provided with contact points on the back side;

FIG. 2, the layer sequence of FIG. 1, whose contact points on the back side have been reinforced with a reinforcement layer;

FIG. 3, the layer sequence of FIG. 2, provided with an auxiliary carrier layer;

FIG. 4, the layer sequence of FIG. 3, after the substrate has been removed;

DETAILED DESCRIPTION OF THE DRAWINGS

Figure 5:
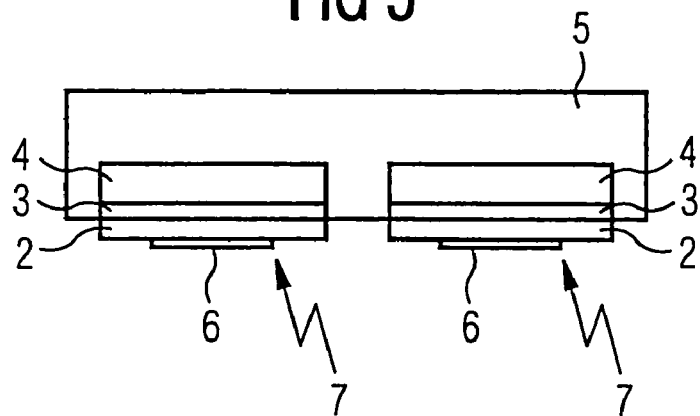
FIG. 5, a cross section through the layer sequence of FIG. 4, provided with contact points on the front side, after the separation into individual chips.

In FIG. 1, a cross section is shown through a layer sequence that has a substrate 1. An active layer 2 is grown on the substrate 1 and includes a photon-emitting active zone. The thickness of the active layer 2 is typically between 5 and 15 μm.

Contact layers are embodied on the back side of the active layer 2, which in the case shown have among other things a base layer 3. By way of the contact layers, current can be fed into the active layer 2.

In a further method step, shown in FIG. 2, a reinforcement layer 4 is applied galvanically to the base layers 3. The reinforcement layer 4 is made from gold, for instance, and has a thickness of 20 to 30 μm.

Next, a surface-covering auxiliary carrier layer 5 is applied to the reinforcement layer 4 and the active layer 2. The application of the auxiliary carrier layer 5 is, for instance, likewise effected galvanically.

Next, the substrate 1 is separated from the active layer 2. This creates the cross section shown in FIG. 4. The thickness of the auxiliary carrier layer 5 is dimensioned such that the layer sequence shown in FIG. 4 offers adequate mechanical strength for the ensuing process steps. The material for the auxiliary carrier layer 5 is moreover selected such that the auxiliary carrier layer 5 can be removed selectively relative to the reinforcement layer 4. For instance, the auxiliary carrier layer 5 can be made from nickel or silver, while the reinforcement layer 4 is made from gold. In that case, the auxiliary carrier layer 5 can be removed selectively relative to the reinforcement layer 4 by means of etching with nitric acid.

In a further method step, contact layers 6 are embodied on the front side of the active layer 2. The active layer 2 is then severed by an etching process. This creates individual semiconductor chips 7. The etching process is conducted such that the active layer 2 of the semiconductor chips 7 is congruent with the contact layers on the back side that are formed by the base layer 3 and the reinforcement layer 4.

Figure 6:
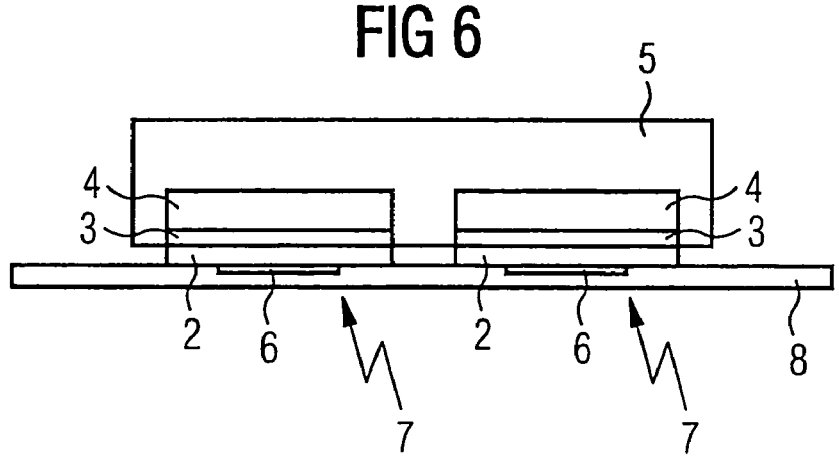
FIG. 6, the layer sequence of FIG. 5, applied to a film.
Figure 7:
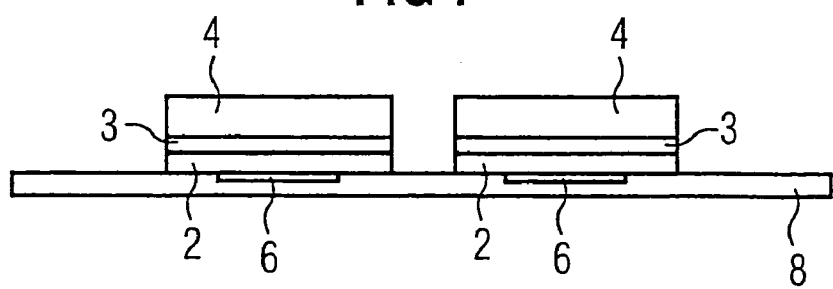
FIG. 7, a cross section through the separated semiconductor chips, resting on the film, after the removal of the auxiliary carrier layer.

To make the semiconductor chips 7 easier to handle, the semiconductor chips 7 are laminated to a film 8 on their front side. The result is the cross section through the layer sequence as shown in FIG. 6. The film can be made of plastic, metal, ceramic materials or compounds and the like.

Finally, the auxiliary carrier layer 5 is removed selectively from the base layers 3 and reinforcement layers 4. The result is individual semiconductor chips 7 that have been applied to the film 8.

The method described offers a number of advantages.

In the method described, the mechanical carrier body used in conventional thin-film processes is replaced by the reinforcement layer 4. The reinforcement layer 4 lends the semiconductor chip 7 adequate mechanical strength, which makes it possible for the semiconductor chips 7 to be handled until they are mounted on a printed circuit board.

Once the substrate 1 has been removed, the auxiliary carrier layer 5 offers an adequate replacement for a mechanical carrier for performing the wafer processing step required to produce the semiconductor chips 7. It is therefore possible to dispense with a further mechanical carrier entirely.

The semiconductor chips 7 moreover have only the components that are indispensable for function: the active layer 2, the contact layers on the back side, formed by the base layer 3 and the reinforcement layer 4, and the contact layers 6 on the front side. The structural size of the semiconductor chips 7 can therefore also be reduced without further difficulties.

For applying the reinforcement layer 4 and auxiliary carrier layer 5, galvanic processes can be employed. These are economical standard methods. Moreover, galvanic layers can also be applied over a large area without problems, for instance without the risk that air will become trapped, a risk that is associated with the bonding of large surfaces.

It is also advantageous that the separation of the semiconductor chips 7 into individual chips is accomplished by etching processes. There is accordingly no need to use sawing methods. As a result, the utilization of the active layer 2 can be increased from 70% to approximately 90%, since on the one hand, sawing tolerances need not be taken into account in the dimensions of the semiconductor chips, and on the other, the material waste of approximately 50 μm per semiconductor chip 7 is eliminated.

The method presented is especially well suited to producing semiconductor chips for light-emitting diodes of high luminance.

The invention claimed is:

1. A method for producing semiconductor chips, comprising the steps of:
   forming an active layer with a photon-emitting zone on a substrate;
   forming an electrical contact layer structured into distinct regions, each region representing an electric contact point for feeding a current into the active layer, on a first side of the active layer, the electrical contact layer being a multi-layered stack including a base layer and a metallic reinforcing layer and having a thickness at least equal to the active layer, the metallic reinforcing layer providing the semiconductor chip with mechanical strength to permit subsequent processing of the semiconductor chip without a carrier body;
   applying an auxiliary carrier layer to the distinct regions of the electrical contact layer so that the auxiliary carrier layer overlaps a main surface of the metallic reinforcing layer remote from the active layer and laterally overlaps side faces of the metallic reinforcing layer; and
   removing the substrate.

2. The method of claim 1, wherein said step of forming the contact points comprises applying the metallic reinforcing layer galvanically.

3. The method of claim 2, wherein the auxiliary carrier layer is applied galvanically.

4. The method of claim 1, wherein the multi-layered stack has at least twice the thickness of the active layer.

5. The method of claim 4, wherein the auxiliary carrier layer is applied galvanically.

6. The method of claim 1, wherein the auxiliary carrier layer is applied galvanically.

7. The method of claim 6, wherein the substrate is removed after applying said auxiliary carrier layer to said metallic reinforcing layer.

8. The method of claim 7, further comprising the step of partitioning the active layer into multiple semiconductor chips after application of the auxiliary carrier layer and removal of the substrate.

9. The method of claim 6, further comprising the step of partitioning the active layer into multiple semiconductor chips after application of the auxiliary carrier layer.

10. The method of claim 9, further comprising the step of laminating to a film a side of the semiconductor chips that is opposite to said auxiliary carrier layer, the film extending laterally beyond at least one of the semiconductor chips.

11. The method of claim 10, further comprising the step of:
   removing said auxiliary carrier layer from said metallic reinforcing layer.

12. The method of claim 9, further comprising the step of:
   removing said auxiliary layer from said metallic reinforcing layer.

13. The method according to claim 1, wherein the metallic reinforcing layer has a thickness between 20 and 30 μm.

14. The method according to claim 1, wherein the active layer has a thickness between 5 and 15 μm.

15. The method according to claim 1, wherein the active layer is an epitaxial layer stack grown on the substrate.

16. The method according to claim 1, wherein the auxiliary carrier layer is formed so as to cover the entire surface of the metallic reinforcing layer in the distinct regions of the electrical contact layer and regions of the surface of the active layer free from the electrical contact layer.

17. The method according to claim 1, wherein the material for the auxiliary carrier layer is selected such that the auxiliary carrier layer is selectively removable relative to the metallic reinforcing layer.

18. The method according to claim 1, wherein the auxiliary carrier layer comprises nickel or silver.

19. The method according to claim 18, wherein the metallic reinforcing layer comprises gold.

20. The method according to claim 19, further comprising the step of:
   removing the auxiliary carrier layer by etching with nitric acid.

21. The method according to claim 1, further comprising the step of:
   forming a further contact on a second side, opposite to the first side, of the active layer;
   wherein semiconductor chips are produced which only consist of the active layer, the electrical contact layer on said first side of the active layer, formed by the base layer and the metallic reinforcing layer, and the contact layer on a the second side of the active layer.

22. A method for producing semiconductor chips comprising the steps of:
- forming an active layer with a photon-emitting zone on a substrate;
- forming a contact point on a first side of the active layer, the contact point being a multi-layered stack including a base layer and a metallic reinforcing layer, said multi-layered stack having a thickness at least equal to the active layer, the metallic reinforcing layer providing the semiconductor chip with mechanical strength to permit subsequent processing of the semiconductor chip without a carrier body;
- applying an auxiliary carrier layer to the metallic reinforcing layer and the active layer so that the auxiliary carrier layer overlaps a main surface of the metallic reinforcing layer remote from the active layer, laterally overlaps with side faces of the reinforcing layer, and overlaps regions of a main surface of the active layer uncovered by the multi-layered stack;
- removing the substrate;
- forming a further contact point on a second side, opposite to the first side, of the active layer; and
- separating the active layer into multiple semiconductor chips;
- wherein the active layer is separated into multiple semiconductor chips after applying said auxiliary carrier layer to said metallic reinforcing layer.

23. The method according to claim 22, wherein semiconductor chips are produced which only consist of the active layer, the electrical contact point, and the further electrical contact point.

24. A method for producing semiconductor chips, comprising the steps in the following order of:
- a) forming an active layer with a photon-emitting zone on a substrate;
- b) forming an electrical contact layer structured into distinct regions, each region representing an electric contact point for feeding a current into the active layer, on one side of the active layer, the electrical contact layer being a multi-layered stack including a base layer and a metallic reinforcing layer and having a thickness at least equal to the active layer, the metallic reinforcing layer providing the semiconductor chip with adequate mechanical strength to permit subsequent processing of the semiconductor chip without a carrier body;
- c) applying an auxiliary carrier layer to the active layer and the distinct regions of the electrical contact layer so that the auxiliary carrier layer overlaps a main surface of the metallic reinforcing layer remote from the active layer, laterally overlaps side faces of the metallic reinforcing layer, and overlaps regions of a main surface of the active layer uncovered by the electrical contact layer;
- d) removing the substrate;
- e) partitioning the active layer into multiple semiconductor chips; and
- f) removing the auxiliary layer.

25. The method according to claim 24, wherein the semiconductor chips are produced which only consist of the active layer, the electrical contact layer on a back side of the active layer, formed by the base layer and the metallic reinforcing layer, and a contact layer on a front side of the active layer.

26. The method according to claim 24, wherein the metallic reinforcing layer has a thickness between 20 and 30 µm.

27. The method according to claim 26, wherein the active layer has a thickness between 5 and 15 µm.

28. A method for producing semiconductor chips, comprising the steps of:
- forming an active layer with a photon-emitting zone on a substrate;
- forming a contact point on a first side of the active layer, the contact point being a multi-layered stack including a base layer and a reinforcing layer, said multi-layered stack having a thickness at least equal to the active layer, the reinforcing layer comprising gold and providing the semiconductor chip with mechanical strength to permit subsequent processing of the semiconductor chip without a carrier body;
- applying an auxiliary carrier layer to the reinforcing layer and the active layer so that the auxiliary carrier layer overlaps a main surface of the reinforcing layer remote from the active layer, laterally overlaps with side faces of the reinforcing layer, and overlaps regions of a main surface of the active layer uncovered by the electrical contact layer;
- removing the substrate;
- forming a further contact point on a second side, opposite to the first side, of the active layer; and
- separating the active layer into multiple semiconductor chips;
- wherein the active layer is separated into multiple semiconductor chips after applying said auxiliary carrier layer to said reinforcing layer.

* * * * *